United States Patent
Chiu et al.

(10) Patent No.: US 10,951,207 B1
(45) Date of Patent: Mar. 16, 2021

(54) INTEGRATED DRIVING MODULE

(71) Applicant: ACBEL POLYTECH INC., New Taipei (TW)

(72) Inventors: Jui-Yang Chiu, New Taipei (TW); Chia-An Yeh, New Taipei (TW)

(73) Assignee: Acbel Polytech Inc., New Taipei (TW)

( * ) Notice: Subject to any disclaimer, the term of this patent is extended or adjusted under 35 U.S.C. 154(b) by 0 days.

(21) Appl. No.: 17/018,190

(22) Filed: Sep. 11, 2020

(30) Foreign Application Priority Data

Jan. 22, 2020 (TW) .................................. 109102545

(51) Int. Cl.
| | | |
|---|---|---|
| *H03K 17/16* | (2006.01) | |
| *H03K 17/691* | (2006.01) | |
| *H02M 1/42* | (2007.01) | |
| *H03K 3/356* | (2006.01) | |
| *H03K 7/08* | (2006.01) | |
| *H02M 1/38* | (2007.01) | |

(52) U.S. Cl.
CPC ............ *H03K 17/162* (2013.01); *H02M 1/38* (2013.01); *H02M 1/4233* (2013.01); *H03K 3/356182* (2013.01); *H03K 7/08* (2013.01); *H03K 17/691* (2013.01)

(58) Field of Classification Search
CPC ............... H03K 17/162; H03K 17/691; H03K 3/356182; H03K 7/08; H02M 1/38; H02M 1/4233
USPC .......................................... 327/108–112, 190
See application file for complete search history.

(56) References Cited

U.S. PATENT DOCUMENTS

2015/0256060 A1* 9/2015 Faingersh ............... H02M 1/36
                                                                 323/267

* cited by examiner

*Primary Examiner* — Tomi Skibinski
(74) *Attorney, Agent, or Firm* — Rosenberg, Klein & Lee (57) ABSTRACT

An integrated driving module includes an oscillator, a PWM unit, a soft start controller, a first driver, and a second driver. The oscillator is connected to a voltage input end and generates an oscillating signal. The PWM unit receives the oscillating signal and generates a first driving control signal and a second driving control signal that are respectively anti-phased. The first driver outputs a first driving output signal to a first output end according to the first driving control signal. The second driver outputs the second driving output signal to a second output end according to the second driving control signal. The integrated driving module only has four connection ends for external connection to provide the two anti-phase driving output signals, such that the circuit design and connection of the primary side of the transformer is greatly simplified. The design limitation and manufacturing cost can be both lowered.

8 Claims, 10 Drawing Sheets

INTEGRATED DRIVING MODULE

CROSS-REFERENCE TO RELATED APPLICATIONS

This application claims the priority benefit of TW application serial No. 109102545, filed on Jan. 22, 2020. The entirety of the above-mentioned patent application is hereby incorporated by reference herein and made a part of the specification.

BACKGROUND OF THE INVENTION

1. Field of the Invention

The present invention is related to a driving module, particularly related to an integrated driving module for generating galvanic isolated power.

2. Description of the Related Art

Figure 9A:
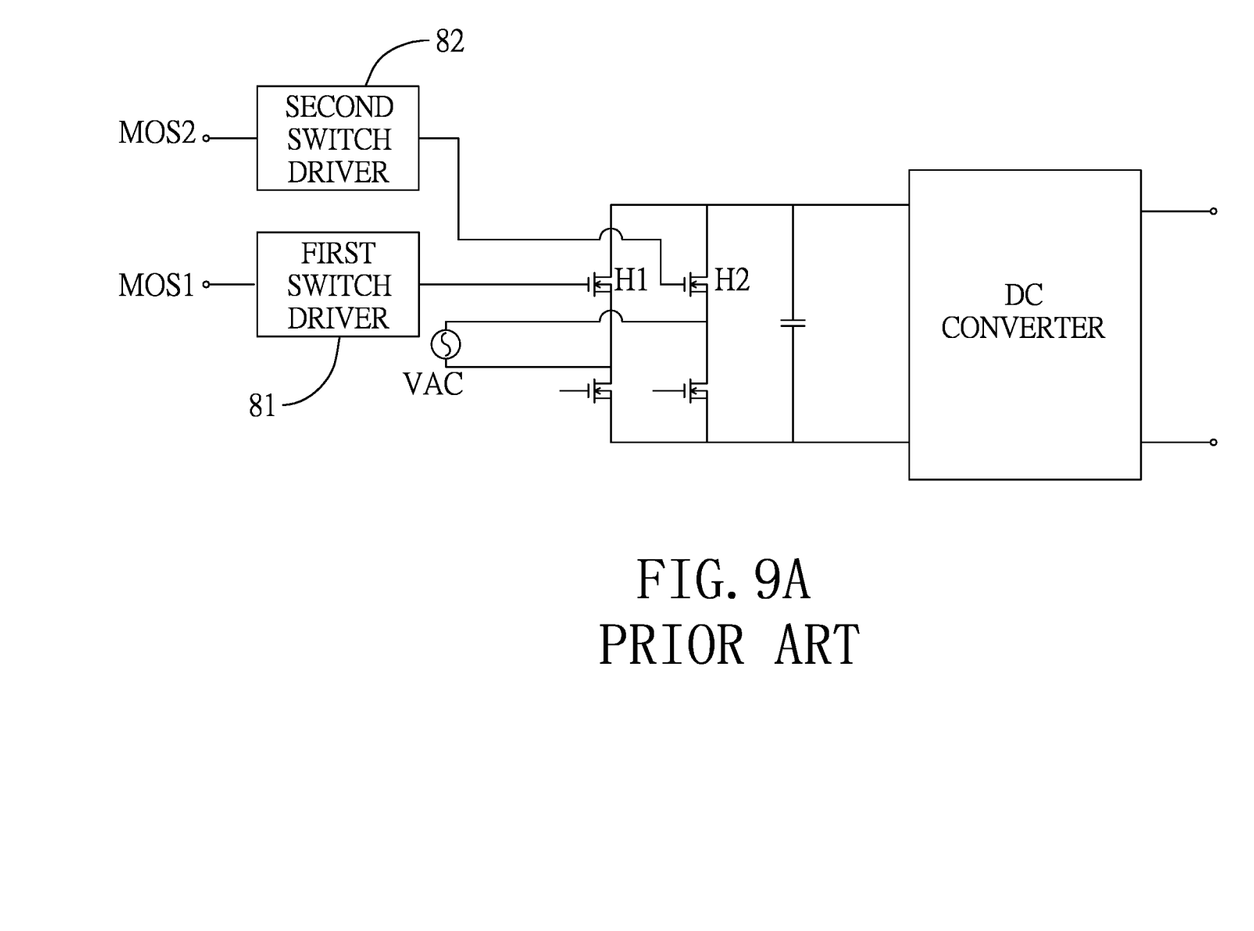
FIG. 9A is a circuit diagram of a conventional power supply device.

The efficiency of power supply devices is being improved in response to market demands. Conventionally, bridge diodes are implemented in power factor correction (PFC) circuits for rectification, causing inevitable power loss. Therefore, a PFC circuit with a non-bridge rectifier is the preferred choice nowadays. With reference to FIG. 9A, in a PFC circuit with a non-bridge rectifier, a Totem Pole circuit is implemented to improve the efficiency. The Totem Pole circuit includes two high-side switch H1, H2 that require galvanic isolated drivers that have isolated input power sources.

Figure 9B:
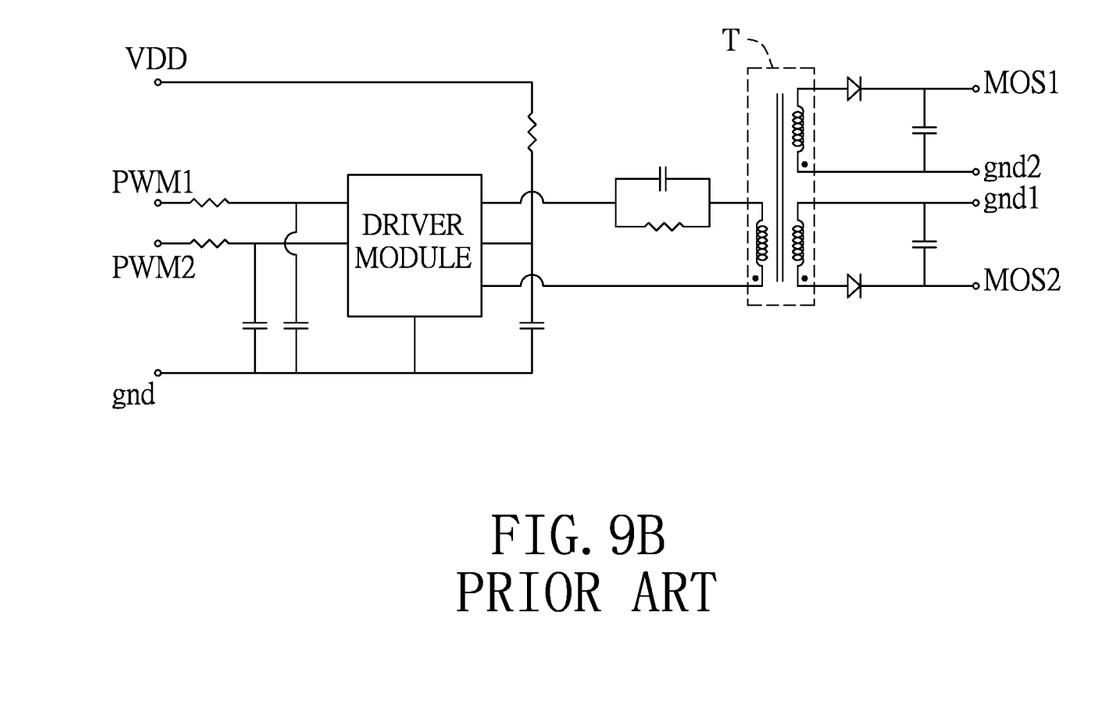
FIG. 9B is a circuit diagram of a driving module for a power factor correction circuit of a conventional power supply device.

To provide galvanic isolated power sources for the totem pole circuit, a power transformer is mostly the choice. With reference to FIG. 9B, the one primary side winding and the two secondary side windings realize the galvanic isolation. The modulation of the turn ratio between the primary side winding and the secondary side windings controls the voltage ratio between the input voltage and the output voltage. A driver module is connected to the primary side winding to improve the driving ability of the input current. The driver module receives two pulse width modulation (PWM) signals that have 180-degree phase difference, and synthesizes an Alternating Current (AC) signal at the primary side of the power transformer. The transformer transforms the alternative signal into two galvanic isolated power sources MOS1, MOS2. The two isolated power sources are then provided to the first switch driver 81 and the second switch driver 82.

The two opposite PWM signals are usually provided by a digital signal processor (DSP) mounted on another controller board. In order to output the two opposite PWM signals, an extra output layout is required on the controller board, which occupies extra space on the controller board. Furthermore, an extra circuit is also necessary to connect the controller board to the driver module. Since the extra circuit is usually a weak point that is vulnerable to noises, it may lead to deformation of the control signals of the switch drivers and cause malfunction of the switch. Furthermore, with the requirement of the extra output ports on the DSP, a low grade DSP chip is not an option and a high end DSP is needed, causing higher manufacturing cost of the power converter.

SUMMARY OF THE INVENTION

To solve the problem of having to receive the two anti-phase PWM signals from a separate control board, which complicates the overall circuit design and causes higher manufacturing cost of the power supply device, the present invention provides an integrated driving module, which includes an oscillator, a pulse width modulation (PWM) unit, a soft start controller, a first driver and a second driver. The oscillator is connected to a voltage input end to receive an input voltage, and the oscillator generates an oscillating signal. The PWM unit is electrically connected to the oscillator to receive the oscillating signal, and generates a first driving control signal and a second driving control signal. The first driving control signal and the second driving control signal have a 180-degree difference in phase. The soft start controller is electrically connected to the voltage input end and the PWM unit. The first driver is connected to the PWM unit, a ground end, and a first output end, and the second driver is connected to the PWM unit, the ground end, and a second output end. The first driver receives the first driving control signal and generates a first driving output signal which is output to the first output end. The second driver receives the second driving control signal and generates a second driving output signal.

The integrated driving module needs four connecting ends for outside connection: the voltage input end, the ground end, the first output end and the second output end, and the driving module is able to provide the first driving output signal and the second driving output signal that are opposite in phase, which are needed to synthesize the alternative signal at the primary side of the transformer. The transformer outputs the two isolated driving voltages from the two secondary side windings, wherein the two isolated driving voltages are used to drive the two high side switches in a power factor correction circuit.

Namely, with the integrated driving module of the present invention, the primary side of a power converter doesn't need to be connected to the controller board through an extra circuit and input ports to receive the PWM signals. The simplified circuit design avoids the potential noise intervene problem. Furthermore, no extra output port is needed on the controller board and the DSP, and the overall design of the power supply is therefore simplified and manufacturing cost is lowered.

DETAILED DESCRIPTION OF THE INVENTION

Figure 1:
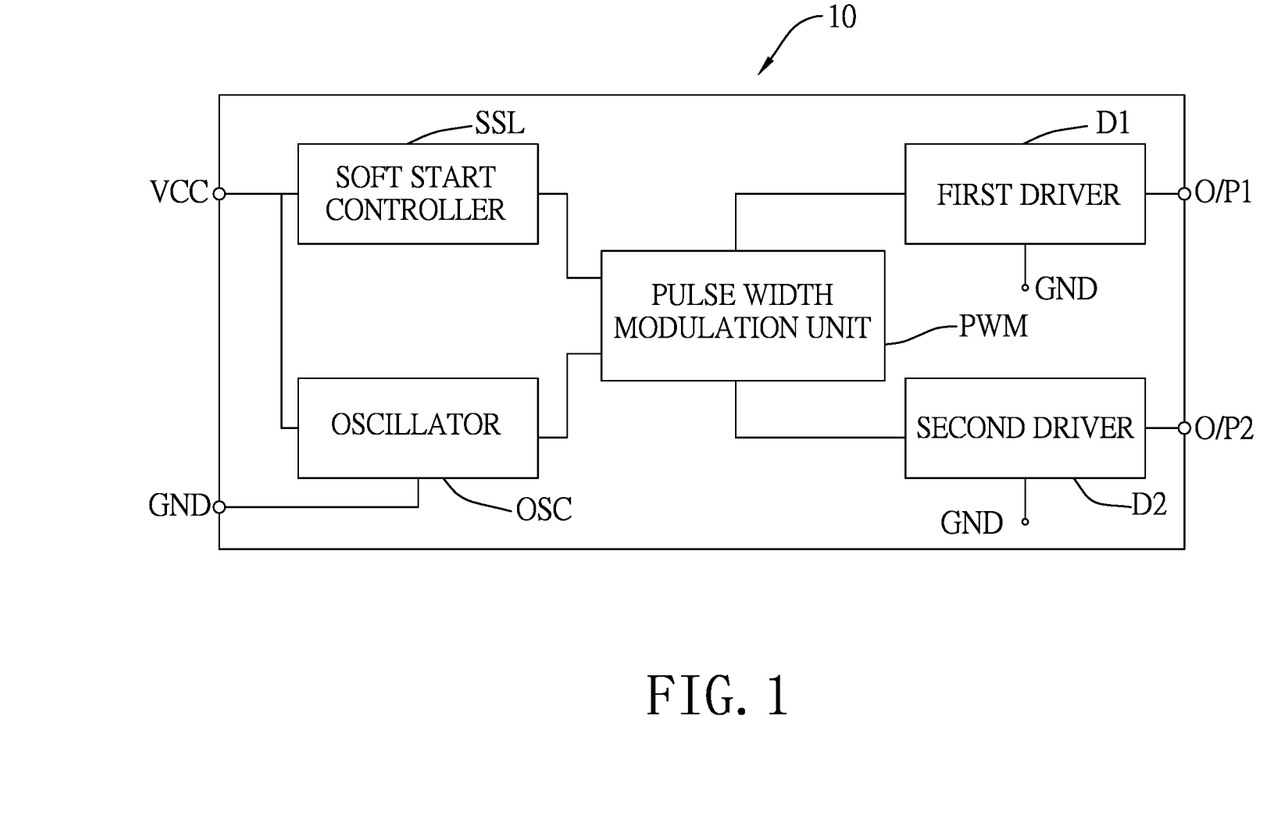
FIG. 1 is a block diagram of an integrated driving module of the present invention.
Figure 2:
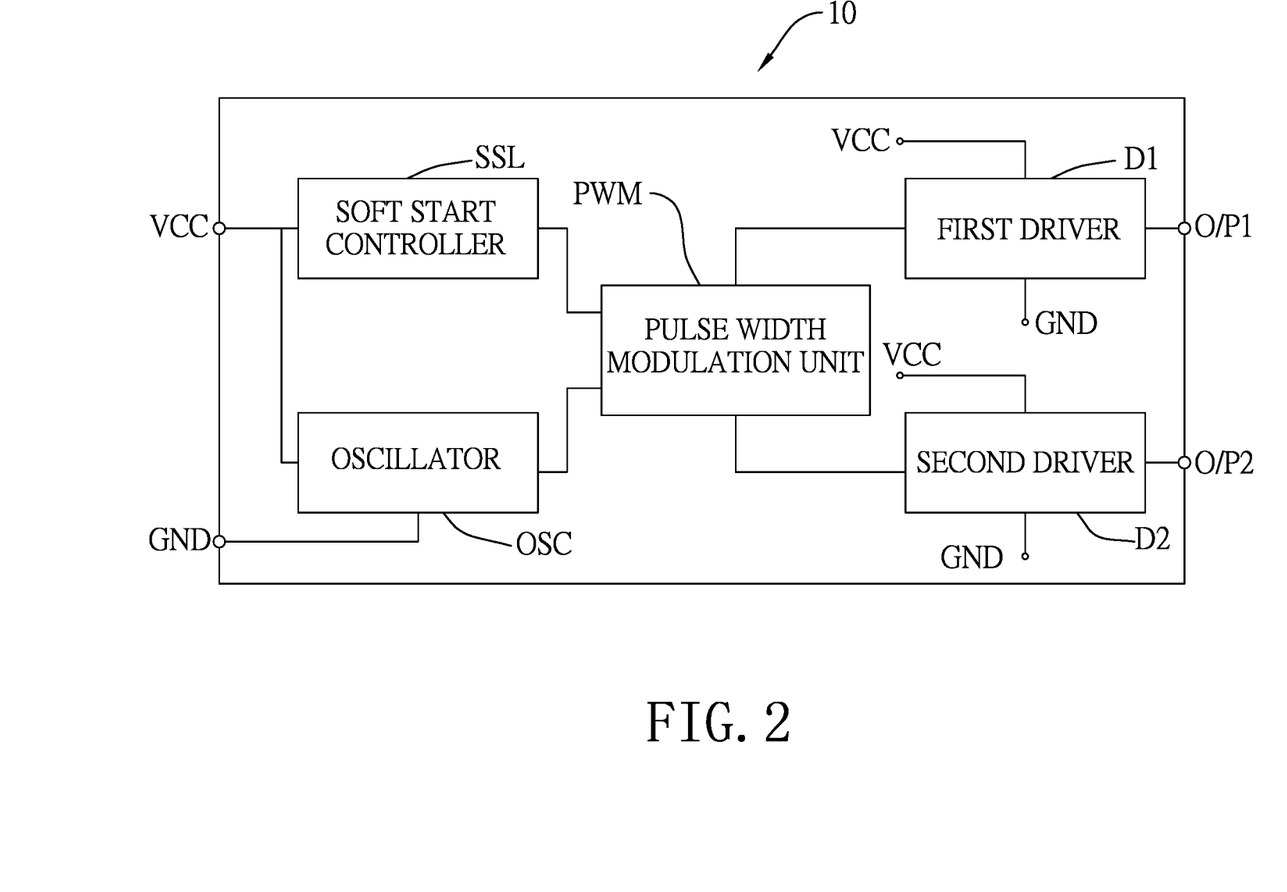
FIG. 2 is a block diagram of a first embodiment of the integrated driving module of the present invention.

With reference to FIG. 1 and FIG. 2, the present invention provides an integrated driving module 10, which is connected to a DC blocking unit 20 at a primary side of a transformer. The integrated driving module 10 includes an oscillator OSC, a pulse width modulation (PWM) unit PWM, a soft start controller SSL, a first driver D1 and a second driver D2. The oscillator OSC is connected to a voltage input end VCC to receive an input voltage, and the oscillator OSC generates an oscillating signal. The PWM unit PWM is electrically connected to the oscillator OSC. The PWM unit PWM receives the oscillating signal, and generates a first driving control signal and a second driving control signal. The soft start controller SSL is connected to the voltage input end VCC and the PWM unit PWM to control a soft start procedure of the PWM unit PWM. The first driver D1 is connected between the PWM unit PWM and a first output end O/P1, and the second driver D2 is connected between the PWM unit PWM and a second output end O/P2. The first driver D1 receives the first driving control signal and generates a first driving output signal. The second driver D2 receives the second driving control signal and generates a second driving output signal. The first driving output signal and the second driving output signal are outputted to the first output end O/P1 and the second output end O/P2 respectively.

Figure 3:
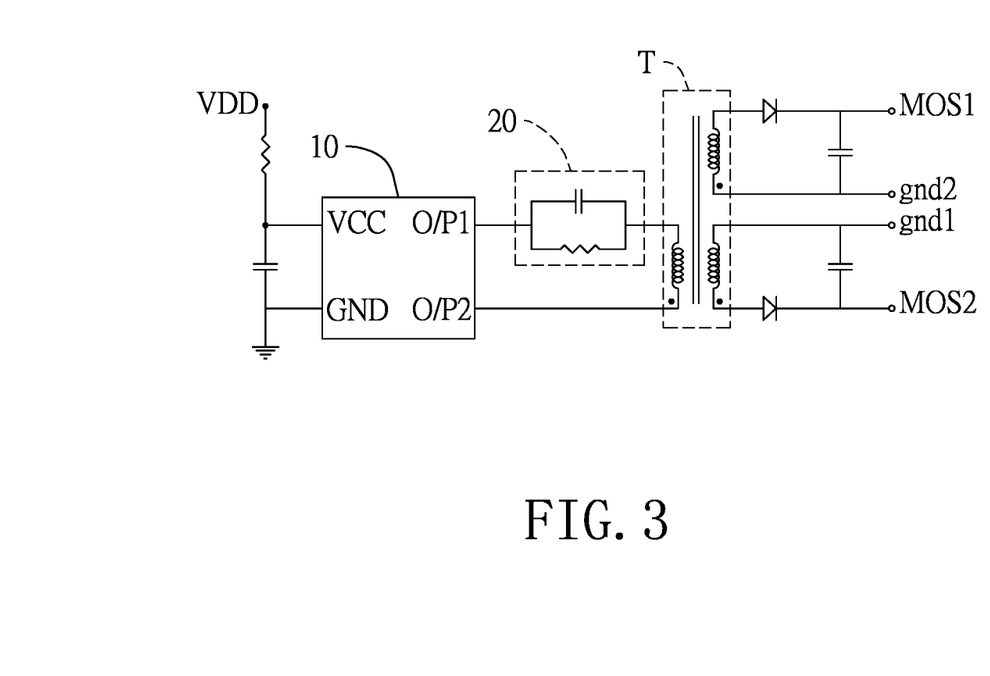
FIG. 3 is a block diagram of an application of the first embodiment of the integrated driving module of the present invention.

With reference to FIG. 2, in a first embodiment of the present invention, the first driver D1 and the second driver D2 are both electrically connected to the voltage input end VCC. The first driver D1 and the second driver D2 transfer the input voltage into the first driving output signal and the second driving output signal according to the first driving control signal and the second driving control signal. In the present embodiment, the high voltage output of the driving module 10 is provided by the input voltage received from the voltage input end VCC. Please refer to FIG. 3, which is a circuit diagram of an application circuit of the first embodiment. The integrated driving module 10 needs only four connection ports, which are the voltage input end VCC, the ground end, the first output end O/P1, and the second output end O/P1. The voltage input end VCC is used for receiving the input voltage, which is the only input end needed for the first driving output signal and the second output signal to be generated and outputted from the first output end O/P1 and the second output end O/P2.

Figure 4:
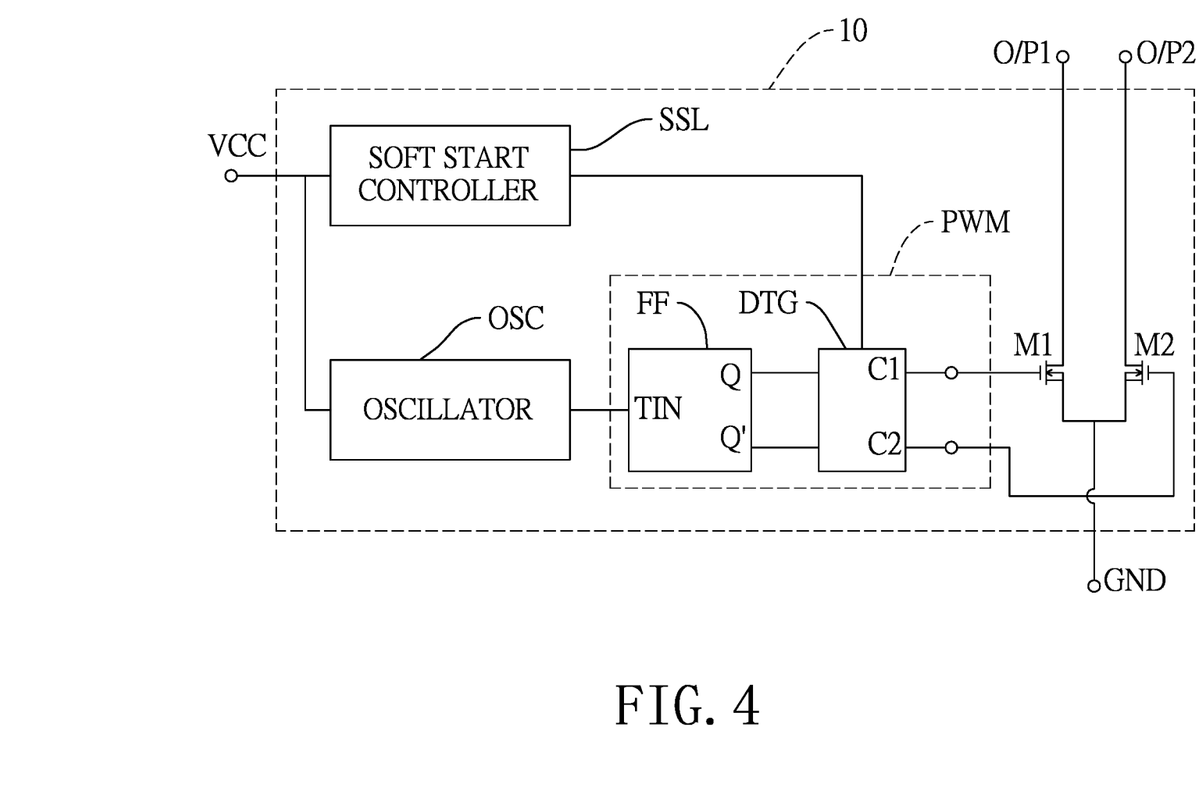
FIG. 4 is a detailed block diagram of the first embodiment of the integrated driving module of the present invention.

With reference to FIG. 4, the PWM unit PWM may further include a flip-flop FF, and a dead time generator DTG. The flip-flop FF has an input end TIN, a first square wave signal output end Q, and a second square wave signal output end Q'. The input end TIN of the flip-flop FF is connected to the oscillator OSC to receive the oscillating signal, and the flip-flop FF generates a first square wave signal and a second square wave signal. The first square wave signal is outputted from the first square wave signal output end Q, and the second square wave signal is outputted from the second square wave signal output end Q'. The dead time generator DTG has a first driving control output end C1 and a second driving control output end C2. The dead time generator DTG is connected to the first square wave signal output end Q and the second square wave signal output end Q' to receive the first square wave signal and the second square wave signal. The dead time generator DTG generates the first driving control signal and the second driving control signal according to the first square wave signal and the second square wave signal by delaying the rising edges. That is, the rising edges of the first driving control signal are delayed for a delaying time from the rising edge of the first square wave signal, and the rising edges of the second driving control signal are delayed for the delaying time from the rising edge of the second square wave signal.

Furthermore, the first driver D1 includes a first driving switch, which is connected between the first output end O/P1 and the ground end GND. The first driving switch has a first control end which is connected to the first driving control output end C1 of the dead time generator DTG. The second driver D2 includes a second driving switch, which is connected between the second output end O/P2 and the ground end GND. The second driving switch has a second control end which is connected to the second driving control output end C2 of the dead time generator DTG. In the present embodiment, the first driver D1 and the second driver D2 are Metal-Oxide-Semiconductor Field-Effect Transistors (MOSFETs) that have an open-drain output connection. In another embodiment, the first driver D1 and the second driver D2 may be bipolar junction transistors (BJTs) that have open-collector output connection. In the present embodiment, the output high voltage of the driving module 10 is provided by an external voltage source.

High level voltages of the first driving output signal and the second driving output signal may be provided by the driving module 10, or may be provided by an extra external voltage source, as elaborated above. The choice can be made according to overall circuit requirement and no limitation is made thereby.

Figure 5:
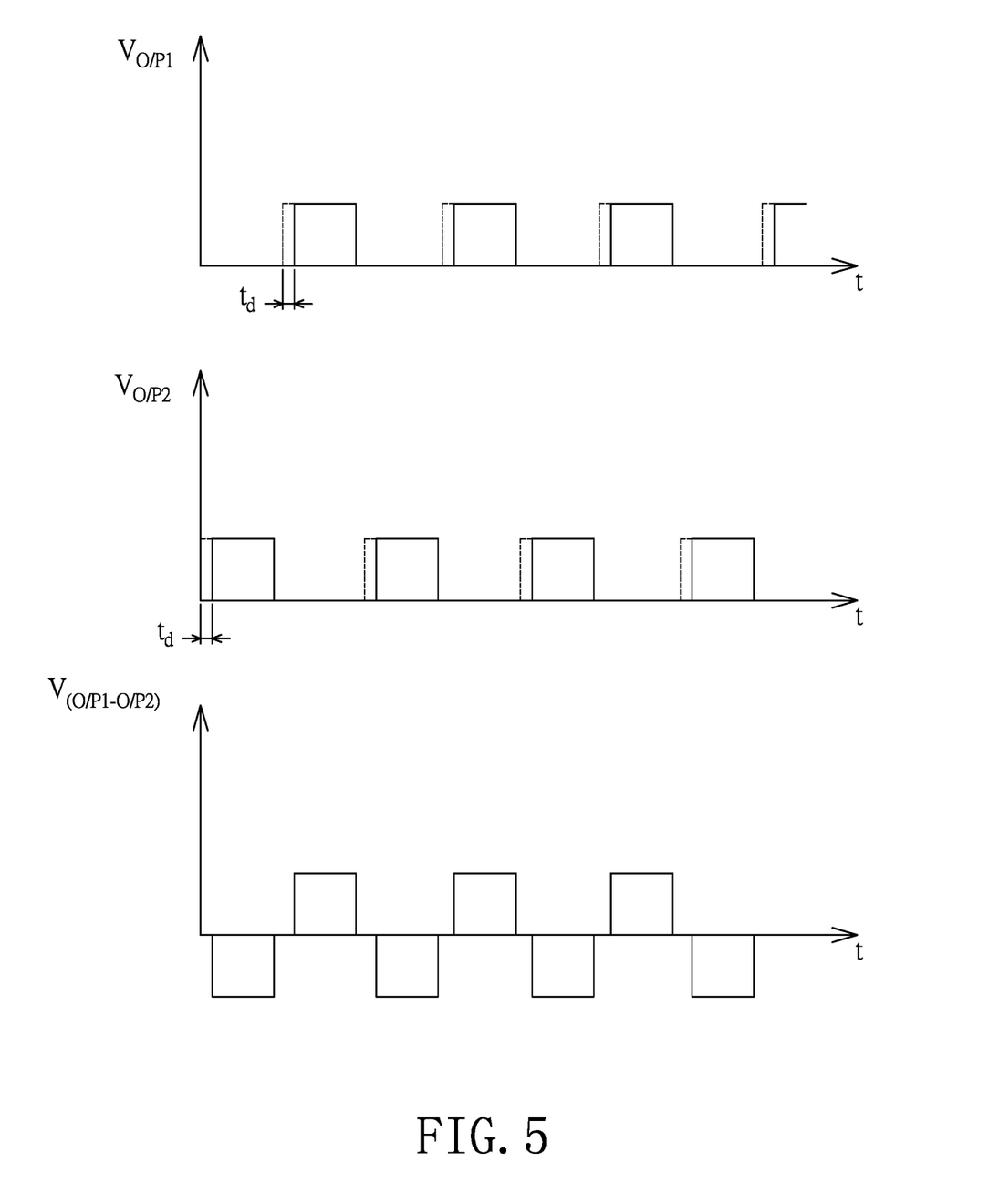
FIG. 5 is a waveform diagram of the first embodiment of the integrated driving module of the present invention.

With reference to FIG. 5, the first driving control signal and the second driving control signal are outputted to the first driver D1 and the second driver D2 to control the conductive statuses. The first driving output signal and the second driving output signal are therefore outputted to the first output end O/P1 and the second output end O/P2 accordingly. The first driving output signal and the second driving output signal are opposite in phase, with the rising edges delayed for the delaying time. As a result, the first output end O/P1 and the second output end O/P1 will not output high-voltages at the same time to avoid irregular noise generated in such circumstance. Together with reference to FIG. 3, the DC blocking unit 20 is connected between the first output end O/P1 and the second output end O/P2 to receive a difference voltage $V_{(O/P1\text{-}P/P2)}$ between the first output end O/P1 and the second output end O/P2. The DC blocking unit transforms the difference voltage $V_{(O/P1\text{-}O/P2)}$ between the first output end O/P1 and the second output end O/P1 into an AC signal, and transfers the AC signal to the primary side winding of the transformer T.

Figure 6:
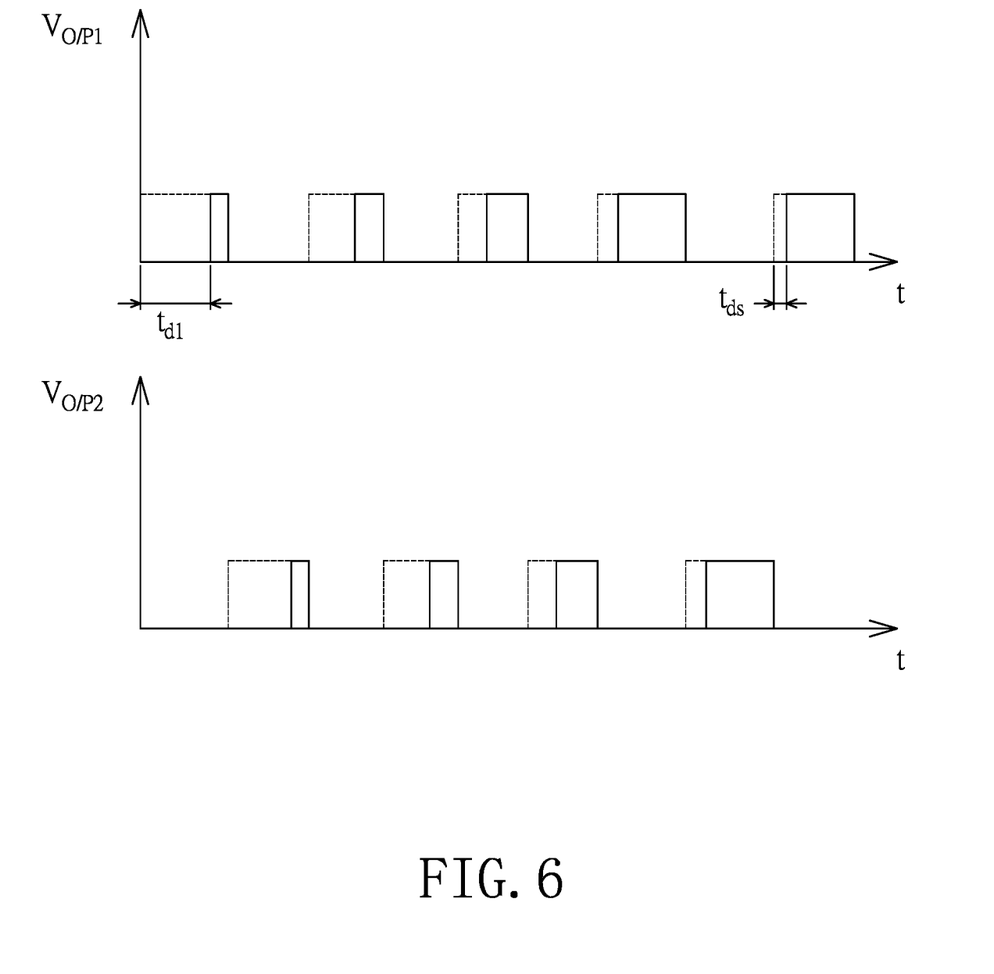
FIG. 6 is another waveform diagram of the first embodiment of the integrated driving module of the present invention.

Further, the soft start controller SSL is connected to the dead time generator DTG to control the dead time generator DTG when the integrated driving module 10 receives a startup voltage. When the soft start controller SSL receives the startup voltage, the soft start controller SSL controls the delaying time of the dead time generator DTG to perform the soft start procedure of the PWM unit PWM. With reference to FIG. 6, when the soft start controller SSL receives the startup voltage, the soft start controller SSL outputs a soft start control signal to the dead time generator DTG, and the dead time generator DTG controls the delaying time $t_d$ to gradually reduce from an initial delaying time $t_{d1}$ to a stable delaying time $t_{ds}$. As a result, the duty ratio of the first driving control signal and the second driving control signal begins at a low duty ratio and gradually rises to a stable duty ratio, and therefore the soft start procedure is performed.

Figure 7:
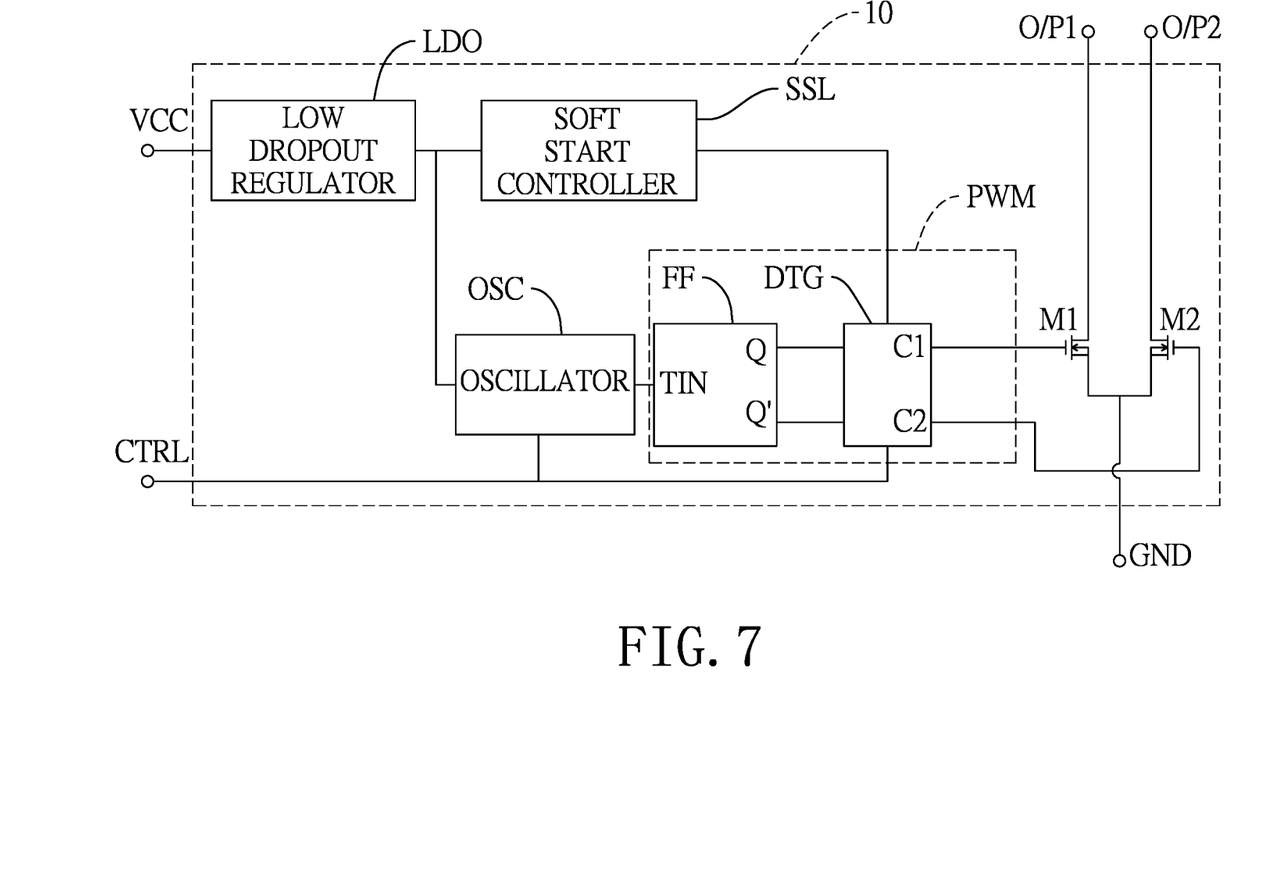
FIG. 7 is a block diagram of a second embodiment of the integrated driving module of the present invention.

With reference to FIG. 7, preferably, the integrated driving module 10 further includes a low dropout (LDO) regulator LDO. The LDO regulator LDO is electrically connected to the voltage input end VCC, and the oscillator OSC and the soft start controller SSL are connected to the voltage input end VCC through the LDO regulator LDO. The LDO regulator LDO receives the input voltage, performs a low dropout regulation and generates a stabilized voltage for the oscillator OSC and the soft start controller SSL.

Also with reference to FIG. 7, in a second embodiment of the present invention, the integrated driving module 10 further includes a control end CTRL. The control end CTRL is connected to the oscillator OSC and the dead time generator DTG of the PWM unit PWM. The control end CTRL is for receiving a control signal from an external circuit. The oscillator OSC controls the frequency of the oscillating signal according to the control signal, and the dead time generator DTG also controls the delaying time according to the control signal.

The control signal received from the control end CTRL may be a digital signal; namely, the control signal is either a high-voltage signal or a low-voltage signal. When the control signal is a high-voltage signal, the frequency of the oscillating signal is a first frequency, and the delaying time of the dead time generator DTG is a first delaying time. When the control signal is a low-voltage signal, the frequency of the oscillating signal is a second frequency, and the delaying time of the dead time generator DTG is a second delaying time.

Moreover, the control signal received from the control end CTRL may be an analog signal. For instance, the control end CTRL is electrically connected to an external variable resistor. The variable resistor generates an adjustable voltage signal, such that the oscillator OSC and the dead time generator DTG can control the frequency of the oscillating signal and the delaying time according to the continuous voltage signal.

Figure 8:
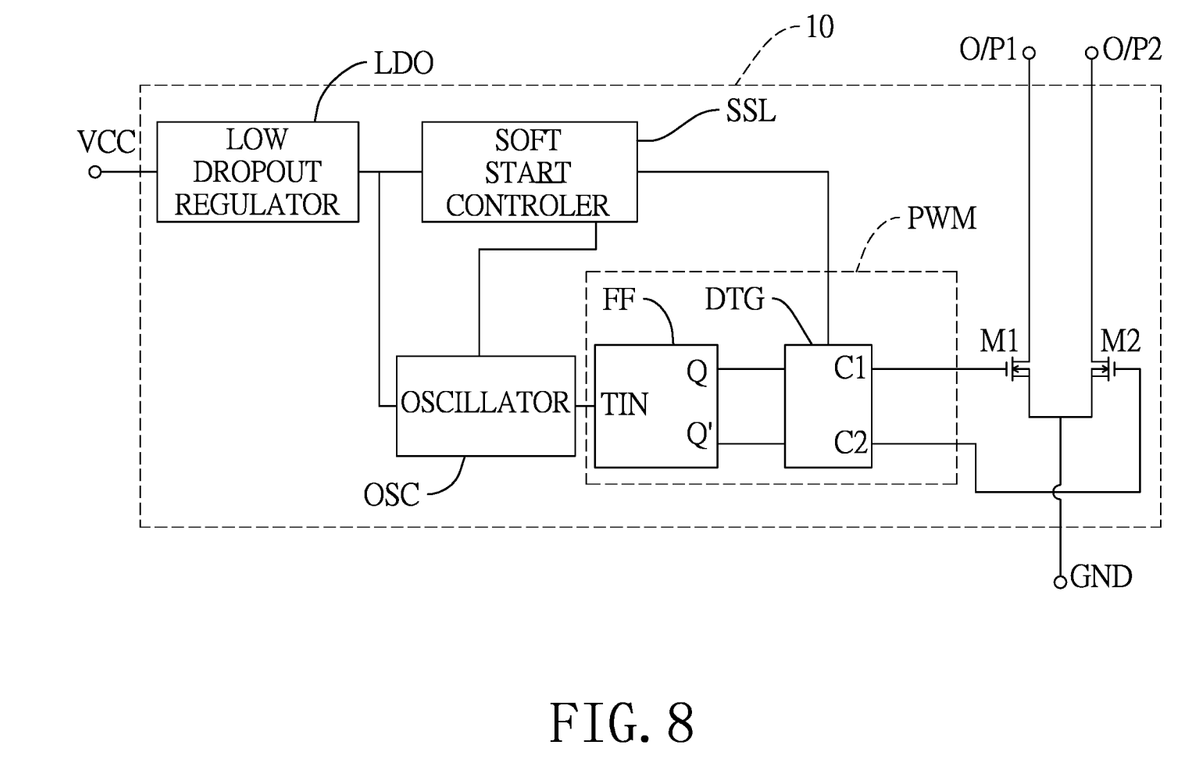
FIG. 8 is a block diagram of a third embodiment of the integrated driving module of the present invention.

With reference to FIG. 8, in a third embodiment of the present invention, the oscillator OSC is connected to the soft start controller SSL. When the soft start controller SSL receives the input voltage from the voltage input end VCC or the stabilized voltage from the low dropout regulator, the soft start controller SSL outputs the soft start control signal to the oscillator OSC to trigger the generation of the oscillating signal.

In conclusion, the integrated driving module 10 of the present invention requires at most five connecting ends, including the control end CTRL, to provide the two antiphase driving output signals that are needed to synthesize an AC signal at the primary side of the transformer T. Therefore, there is no need to design extra layout and I/O ports from the separate control board. Furthermore, with the control signal received from the control end CTRL, the frequency and delaying time of the first driving output signal and the second driving output signal are easily regulated and adjustable. Therefore, the circuit and layout design of the control board and the primary side of the transformer T are simplified with lower cost and design limitation.

Even though numerous characteristics and advantages of the present invention have been set forth in the foregoing description, together with details of the structure and features of the invention, the disclosure is illustrative only. Changes may be made in the details, especially in matters of shape, size, and arrangement of parts within the principles of the invention to the full extent indicated by the broad general meaning of the terms in which the appended claims are expressed.

What is claimed is:

1. An integrated driving module, comprising:
   an oscillator, connected to a voltage input end, receiving an input voltage, and generating an oscillating signal;
   a pulse width modulation (PWM) unit, electrically connected to the oscillator, receiving the oscillating signal, and generating a first driving control signal and a second driving control signal that are respectively inverted;
   a soft start controller, electrically connected to the voltage input end and the PWM unit;
   a first driver, connected to the PWM unit, a ground end, and a first output end, receiving the first driving control signal, and generating a first driving output signal;
   a second driver, connected to the PWM unit, the ground end, and a second output end, receiving the second driving control signal, and generating a second driving output signal.

2. The integrated driving module as claimed in claim 1, wherein the PWM unit comprises:
   a flip-flop, having an input end, a first square wave signal output end, and a second square wave signal output end; wherein the input end of the flip-flop is connected to the oscillator to receive the oscillating signal, and the flip-flop generates the first square wave signal and the second square wave signal accordingly;
   a dead time generator, electrically connected to the first square wave signal output end and the second square wave signal output end of the flip-flop, and having a first driving control output end and a second driving control output end; the dead time generator generating the first driving control signal and the second driving control signal according to the first square wave signal and the second square wave signal; wherein
   rising edges of the first driving control signal and the second driving control signal are delayed for a delaying time by rising edges of the first square wave signal and the second square wave signal.

3. The integrated driving module as claimed in claim 2, wherein
   when the soft start controller receives a startup voltage from the voltage input end, the soft start controller outputs a soft start control signal to the dead time generator; wherein the dead time generator controls the delaying time, according to the soft start control signal, to reduce from an initial delaying time to a stable delaying time.

4. The integrated driving module as claimed in claim 2, wherein the oscillator and the PWM unit are connected to a control end, and receive a control signal from the control end; wherein
   the oscillator controls a frequency of the oscillating signal according to the control signal;
   the dead time generator controls the delaying time according to the control signal.

5. The integrated driving module as claimed in claim 4, wherein the control signal is either a high-voltage signal or a low-voltage signal;
   when the control signal is the high-voltage signal, the oscillating signal has a first frequency, and the delaying time is a first delaying time; and
   when the control signal is the low-voltage signal, the oscillating signal has a second frequency, and the delaying time is a second delaying time.

6. The integrated driving module as claimed in claim 4, wherein the control end is connected to a variable resistor.

7. The integrated driving module as claimed in claim 1, wherein the first driver comprises a first driver switch, the first driver switch is connected between the first output end and the ground end, and a first control end of the first driver switch is connected to the first driving control output end of the dead time generator; and the second driver comprises a second driver switch, the second driver switch is connected between the second output end and the ground end, and a second control end of the second driver switch is connected to the second driving control output end of the dead time generator.

8. The integrated driving module as claimed in claim 1, further comprising:

a low dropout regulator, electrically connected to the voltage input end, receiving the input voltage and performing a low dropout regulation to generate a stabilized voltage; wherein the oscillator is connected to the voltage input end through the low dropout regulator.

\* \* \* \* \*